United States Patent
Zimmermann et al.

(10) Patent No.: US 11,029,370 B1
(45) Date of Patent: Jun. 8, 2021

(54) SENSOR OUTPUT CONTROL METHODS AND APPARATUS

(71) Applicant: Allegro MicroSystems, LLC, Manchester, NH (US)

(72) Inventors: Jonathan Zimmermann, Manchester, NH (US); Steven E. Snyder, New Boston, NH (US); Pablo Daniel Pareja Obregón, Buen Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/881,238

(22) Filed: May 22, 2020

(51) Int. Cl.
- *G01R 33/07* (2006.01)
- *G01R 33/00* (2006.01)
- *G01R 19/155* (2006.01)
- *G01R 1/20* (2006.01)

(52) U.S. Cl.
CPC ......... *G01R 33/0041* (2013.01); *G01R 1/203* (2013.01); *G01R 19/155* (2013.01); *G01R 33/0029* (2013.01); *G01R 33/072* (2013.01)

(58) Field of Classification Search
None
See application file for complete search history.

(56) References Cited

U.S. PATENT DOCUMENTS

| | | | |
|---|---|---|---|
| 5,389,889 A | 2/1995 | Towne et al. | |
| 6,002,338 A | 12/1999 | Pavlov et al. | |
| 6,111,437 A | 8/2000 | Patel | |
| 6,288,567 B1 | 9/2001 | Fink | |
| 6,542,847 B1 | 4/2003 | Lohberg et al. | |
| 6,687,644 B1 | 2/2004 | Zinke et al. | |
| 6,815,944 B2 | 11/2004 | Vig et al. | |

(Continued)

FOREIGN PATENT DOCUMENTS

| | | |
|---|---|---|
| DE | 19634714 A1 | 3/1998 |
| DE | 19650935 A1 | 6/1998 |

(Continued)

OTHER PUBLICATIONS

U.S. Appl. No. 62/337,478, filed May 17, 2016, Burdette et al.

(Continued)

*Primary Examiner* — Jas A Sanghera
(74) *Attorney, Agent, or Firm* — Daly, Crowley, Mofford & Durkee, LLP

(57) ABSTRACT

A sensor configured to generate a sensor output signal at a sensor output coupled to a pull up voltage through a pull up resistor includes a sensing element configured to generate a sensing element output signal indicative of a sensed parameter and a processor responsive to the sensing element output signal and configured to generate a processor output signal indicative of the sensed parameter. A digital output controller is responsive to the processor output signal and to a digital feedback signal and is configured to generate a controller output signal. An analog output driver is responsive to the controller output signal and configured to generate the sensor output signal at a first predetermined level or at a second predetermined level and a feedback circuit coupled between the sensor output and the digital output controller is configured to generate the digital feedback signal in response to the sensor output signal.

21 Claims, 6 Drawing Sheets

(56) References Cited

U.S. PATENT DOCUMENTS

| | | |
|---|---|---|
| 6,968,484 B2 | 11/2005 | Hummel |
| 7,026,808 B2 | 4/2006 | Vig et al. |
| 7,319,418 B2 | 1/2008 | Fink |
| 7,747,146 B2 | 6/2010 | Milano et al. |
| 8,054,071 B2 | 11/2011 | Doogue et al. |
| 8,084,969 B2 | 12/2011 | David et al. |
| 8,183,982 B2 | 5/2012 | Scherr |
| 8,350,563 B2 | 1/2013 | Haas et al. |
| 8,519,819 B2 | 8/2013 | Scherr |
| 8,577,634 B2 | 11/2013 | Donovan et al. |
| 8,624,588 B2 | 1/2014 | Vig et al. |
| 8,754,640 B2 | 6/2014 | Vig et al. |
| 8,860,404 B2 | 10/2014 | Dwyer et al. |
| 8,922,331 B2 | 12/2014 | Scherr |
| 8,994,369 B2 | 3/2015 | Vig et al. |
| 9,068,859 B2 | 6/2015 | Dwyer et al. |
| 9,151,771 B2 | 10/2015 | Vig et al. |
| 9,172,565 B2 | 10/2015 | Cadugan et al. |
| 9,222,990 B2 | 12/2015 | Dwyer et al. |
| 9,245,547 B1 | 1/2016 | Latham et al. |
| 9,300,235 B2 | 3/2016 | Ng et al. |
| 9,621,140 B1 | 4/2017 | Fernandez et al. |
| 9,634,715 B2 | 4/2017 | Scheinkerman et al. |
| 9,664,748 B2 | 5/2017 | Friedrich et al. |
| 9,698,742 B2 | 7/2017 | Chaware et al. |
| 9,787,495 B2 | 10/2017 | Vreeland et al. |
| 10,101,410 B2 | 10/2018 | Latham et al. |
| 10,216,559 B2 | 2/2019 | Fernandez |
| 10,436,606 B2 | 10/2019 | Kerdraon et al. |
| 10,473,486 B2 | 11/2019 | Doogue et al. |
| 10,480,957 B2 | 11/2019 | Kerdraon et al. |
| 10,481,218 B2 | 11/2019 | Prentice et al. |
| 10,495,485 B2 | 12/2019 | Burdette et al. |
| 10,571,301 B2 | 2/2020 | Doogue et al. |
| 10,578,679 B2 | 3/2020 | Sitorus et al. |
| 10,598,514 B2 | 3/2020 | Pepka et al. |
| 10,656,170 B2 | 5/2020 | Lim et al. |
| 10,725,122 B2 | 7/2020 | Rubinsztain et al. |
| 10,747,708 B2 | 8/2020 | Kozomora et al. |
| 10,782,366 B2 | 9/2020 | Stewart |
| 10,908,230 B2 | 2/2021 | Rubinsztain et al. |
| 2002/0021144 A1 | 2/2002 | Morgan et al. |
| 2003/0141862 A1 | 7/2003 | Vig et al. |
| 2005/0144546 A1 | 6/2005 | Igeta et al. |
| 2006/0156075 A1 | 7/2006 | Mitsuishi |
| 2009/0075607 A1 | 3/2009 | Khoury |
| 2010/0026279 A1 | 2/2010 | Vig et al. |
| 2010/0211347 A1 | 8/2010 | Friedrich et al. |
| 2012/0007680 A1 | 1/2012 | Hijikata et al. |
| 2013/0335069 A1 | 12/2013 | Vig et al. |
| 2013/0335074 A1 | 12/2013 | Dwyer et al. |
| 2014/0208151 A1 | 7/2014 | Fernandez |
| 2014/0237298 A1 | 8/2014 | Pe'er |
| 2015/0185279 A1 | 7/2015 | Milano et al. |
| 2015/0249385 A1 | 9/2015 | Takahashi |
| 2015/0269018 A1 | 9/2015 | Ellis |
| 2016/0025820 A1 | 1/2016 | Scheller et al. |
| 2016/0097692 A1 | 4/2016 | Hirai et al. |
| 2016/0097825 A1* | 4/2016 | Petrie .................. G01R 33/072 324/207.22 |
| 2016/0123780 A1 | 5/2016 | Snyder et al. |
| 2016/0139230 A1 | 5/2016 | Petrie et al. |
| 2017/0092024 A1 | 3/2017 | Slama et al. |
| 2017/0219662 A1 | 8/2017 | Prentice et al. |
| 2018/0129196 A1 | 5/2018 | Hainz et al. |
| 2018/0136999 A1 | 5/2018 | Fernandez |
| 2018/0275823 A1 | 9/2018 | Lim |
| 2019/0018079 A1 | 1/2019 | Latham et al. |
| 2019/0346294 A1 | 11/2019 | Coceani et al. |
| 2020/0386575 A1 | 12/2020 | Weiland et al. |
| 2020/0409886 A1 | 12/2020 | Bussing et al. |

FOREIGN PATENT DOCUMENTS

| | | |
|---|---|---|
| DE | 19900774 A1 | 7/2000 |
| EP | 0944888 A2 | 9/1999 |
| WO | WO 9825148 A2 | 6/1998 |
| WO | WO 2010/150416 | 12/2010 |

OTHER PUBLICATIONS

U.S. Appl. No. 16/787,326, filed Feb. 11, 2020, Metivier et al.
U.S. Appl. No. 16/788,505, filed Feb. 12, 2020, Scheller et al.
U.S. Appl. No. 16/935,656, filed Jul. 22, 2020, Metivier et al.
Allegro Datasheet A19530 "High Feature Three-Wire Hall-Effect Transmission Speed and Direction Sensor IC" Sep. 13, 2018, 18 pages.
Office Action dated Apr. 19, 2018 for U.S. Appl. No. 15/350,400; 18 pages.
Response to Office Action filed on May 9, 2018 for U.S. Appl. No. 15/350,400; 18 pages.
Final Office Action dated Aug. 6, 2018 for U.S. Appl. No. 15/350,400; 24 pages.
Response to Final Office Action filed on Nov. 5, 2018 for U.S. Appl. No. 15/350,400; 18 pages.
Notice of Allowance dated Nov. 21, 2018 for U.S. Appl. No. 15/350,400; 7 pages.
PCT International Search Report and Written Opinion dated Mar. 8, 2018 for International Application No. PCT/US2017/059148; 16 pages.
PCT International Preliminary Report dated May 14, 2019 for Intl. Pat. Appl. No. PCT/US2017/059148; 9 pages.
Korean Office Action (with Machine English Translation from Espacenet.com) dated Aug. 28, 2020 for Korean Application No. 10-2019-7013456; 15 Pages.
Response (with Machine English Translation from Espacenet.com) to Korean Office Action dated Aug. 28, 2020 for Korean Application No. 10-2019-7013456; Response filed Oct. 28, 2020; 102 Pages.
Korean Office Action (with Machine English Translation from Espacenet.com) dated Nov. 6, 2020 for Korean Application No. 10-2019-7013456; 6 Pages.
Response (with Machine English Translation from Espacenet.com) to Korean Office Action dated Nov. 6, 2020 for Korean Application No. 10-2019-7013456; Response filed Dec. 8, 2020; 22 Pages.
European 161/162 Communication dated Jun. 6, 2019 for European Application No. 17809079.1; 3 Pages.
Response to Office Action filed on Dec. 16, 2019 for European Application No. 17809079.1; 28 pages.
Office Action dated Apr. 2, 2020 for U.S. Appl. No. 16/040,716; 20 pages.
Response to Office Action filed on Apr. 23, 2020 for U.S. Appl. No. 16/040,716; 14 pages.
Notice of Allowance dated May 6, 2020 for U.S. Appl. No. 16/040,716; 10 pages.
Extended Search Report dated Dec. 12, 2019 for European Application No. 19185340.7; 7 pages.
Response (with Amended Claims & Specification) to European Official Communication dated Jan. 27, 2020 and to Search Opinion dated Dec. 12, 2019 for European Application No. 19185340.7; Response filed Jul. 22, 2020; 24 Pages.
Office Action dated Jul. 22, 2020 for U.S. Appl. No. 16/901,103; 20 pages.
Response to Office Action filed on Aug. 13, 2020 for U.S. Appl. No. 16/901,103; 11 pages.
Notice of Allowance dated Nov. 23, 2020 for U.S. Appl. No. 16/901,103; 11 pages.
European Examination Report dated Mar. 18, 2021 for European Application No. 19185340.7, 5 Pages.

* cited by examiner

SENSOR OUTPUT CONTROL METHODS AND APPARATUS

CROSS REFERENCE TO RELATED APPLICATIONS

Not Applicable.

STATEMENT REGARDING FEDERALLY SPONSORED RESEARCH

Not Applicable.

FIELD

The present disclosure relates generally to sensor output control methods and apparatus.

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of a target object, such as a ferromagnetic object in the form of a gear or ring magnet, or to sense a current, as examples.

Sensor integrated circuits are widely used in automobile control systems and other safety critical applications. There are a variety of specifications that set forth requirements related to permissible sensor quality levels, failure rates, and overall functional safety. In compliance with certain safety requirements, such as ASIL (Automotive Safety Integrity Level) requirements, a failure of the sensor is required to be communicated to the user or otherwise output by the sensor.

Sensor integrated circuits have a power connection and a ground connection and can provide one or more output signals in different forms. For example, in some sensors, the output signal is provided as a voltage in a so-called three wire, or three terminal output configuration, in which the sensor has an output terminal (i.e., a third terminal) at which the output signal is provided. In the case of two output signals, a fourth terminal is provided. Other sensors provide an output signal in the form of a current in a so-called two wire or two terminal output configuration, in which the output current is superimposed on the power and ground connections to the sensor. In some three wire or four terminal sensors, the voltage output signal or signals are provided at a so-called open drain output (i.e., at a drain terminal of Field Effect Transistor (FET) that is coupled to a pull up voltage (VPU) through a pull up resistor (RPU)).

SUMMARY

The present disclosure provides a sensor with a digital output control feedback loop that dynamically compensates, or calibrates for a load that can include a wide range of pull up voltages and pull up resistances. The sensor measures the pull up voltage and computes the pull up resistance and dynamically compensates for their wide range of user selectable values in order to achieve and maintain desired output signal levels, which output signal levels can include a plurality of levels or ranges of levels to communicate desired information. Because the digital output control feedback loop compensates for the pull up voltage and pull up resistance levels, diagnostics performed on the sensor output can accurately determine if an output fault has occurred. Customizable output signal slew rate and shaping can be implemented with the digital output control feedback loop.

According to the disclosure, a sensor configured to generate a sensor output signal at a sensor output coupled to a pull up voltage through a pull up resistor includes a sensing element configured to generate a sensing element output signal indicative of a sensed parameter and a processor responsive to the sensing element output signal and configured to generate a processor output signal indicative of the sensed parameter. A digital output controller is responsive to the processor output signal and to a digital feedback signal and is configured to generate a controller output signal. An analog output driver responsive to the controller output signal and configured to generate the sensor output signal at a first predetermined level or at a second predetermined level and a feedback circuit coupled between the sensor output and the digital output controller is configured to generate the digital feedback signal in response to the sensor output signal.

The sensor can include one or more of the following features alone or in combination. The analog output driver can include a controllable current sink having a having a first terminal at which the sensor output signal is provided, a second terminal, and a third, control terminal responsive to a control signal. The analog output driver can further include a first circuit path, a second circuit path, and a summation element. The first circuit path can include a first DAC, a first low pass filter coupled to an output of the first DAC, and a first gain adjustment DAC coupled to an output of the first low pass filter and configured to generate an upper analog adjustment signal and the second circuit path can include a second DAC, a second low pass filter coupled to an output of the second DAC, and a second gain adjustment DAC coupled to an output of the second low pass filter and configured to generate a lower analog adjustment signal. The summation element is coupled to the first gain adjustment DAC and the second gain adjustment DAC and is configured to generate a summation signal indicative of a summation of the upper analog adjustment signal and the lower analog adjustment signal. The analog output driver can further include an offset adjustment DAC responsive to the summation signal and configured to generate an analog version of the summation signal and a current mirror responsive to the analog version of the summation signal and configured to generate the control signal for coupling to the control terminal of the controllable current sink.

The feedback circuit can include a feedback gain element configured to adjust the sensor output signal and a system monitor ADC configured to convert the gain-adjusted sensor output signal into the digital feedback signal. The analog output driver can be further configured to generate the sensor output signal at a third level that is different than the first level and the second level when a fault is detected. The third level of the sensor output signal can correspond to a supply voltage or ground. In some embodiments, the first predetermined level of the sensor output signal can be a first percentage of the pull up voltage and the second predetermined level of the sensor output signal can be a second percentage of the pull up voltage that is different than the first percentage. In some embodiments, the first predetermined level of the sensor output signal can be within a first range of percentages of the pull up voltage and the second predetermined level of the sensor output signal can be within a second range of percentages of the pull up voltage that is different than the first range of percentages. The controllable current sink can include a field effect transistor. The sensing element can include one or more magnetic field sensing elements. The sensed parameter can include one or more of a magnetic field strength, a proximity of a target, a speed of motion of the target, a direction of motion of the target, an angular position of the target, a current level, a light level, or a pressure level. The processor output signal can be a logic signal having a logic high level or a logic low level, wherein the sensor output signal is at the first predetermined level when the processor output signal is at the logic high level and at the second predetermined level when the processor output signal is at the logic low level. The sensor can include an integrated circuit with the sensor output signal provided at an output terminal of the integrated circuit, wherein the pull up resistor and the pull up voltage are external to the integrated circuit. The digital output controller can be configured to adjust a slew rate of the sensor output signal. The digital output controller can be configured to compute a resistance of the pull up resistor.

Also described is a method for generating an output signal at an output of a sensor that is coupled to a pull up voltage through a pull up resistor, the sensor output signal at a first predetermined level or a second predetermined level. The method includes detecting the pull up voltage, sinking a first current level with a current sink coupled to the sensor output, detecting a first voltage level of the sensor output signal, and computing the resistance of the pull up resistor based on the first current level and the first voltage level. A first level of current through the current sink that corresponds to generating the sensor output signal at the first predetermined level is computed. A second level of current through the current sink that corresponds to generating the sensor output signal at the second predetermined level is also computed. The first computed current level can be applied to the current sink and the sensor output can be allowed to switch between the first predetermined output signal level and the second predetermined output signal level.

The method can include one or more of the following features alone or in combination. The method can include sinking a second current level with a current sink coupled to the sensor output and detecting a second voltage level of the sensor output signal, wherein computing the resistance of the pull up resistor is based on the first current level, the first voltage level, the second current level and the second voltage level. The method may further include determining an error correction based on a difference between the sensor output signal level when the current sink sinks the first computed current level and the first predetermined sensor output signal level and applying the error correction to first computed level of current and to the second computed level of current. Detecting the pull up voltage can include turning off the current sink for a predetermined duration after a sensor reset event occurs. The method may further include detecting a fault, wherein allowing the sensor output to switch includes allowing the sensor output to switch to a third level different than the high output level or the low output level when the fault is detected.

BRIEF DESCRIPTION

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
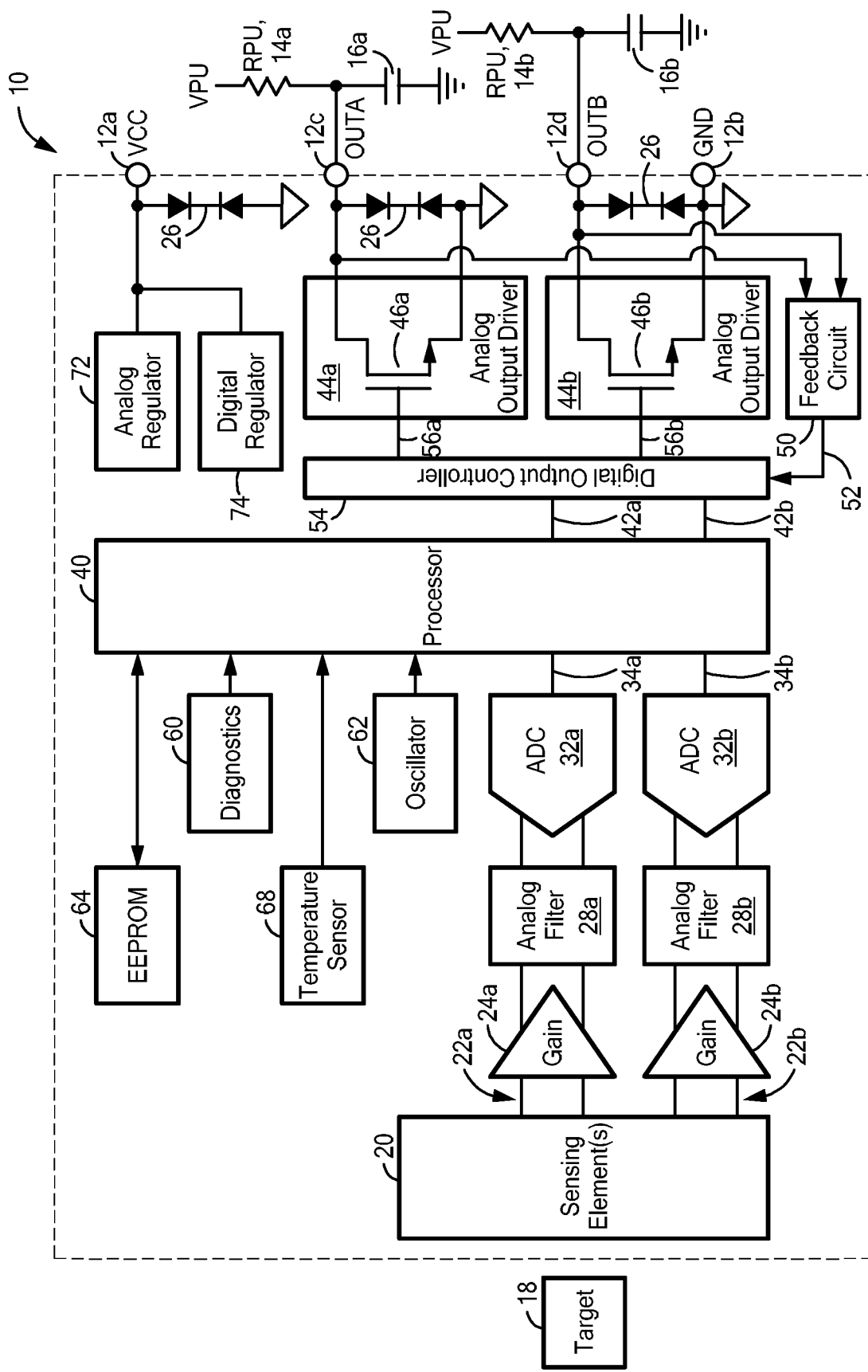
FIG. 1 is a block diagram of a sensor including a digital output control feedback loop according to the disclosure.

Referring to FIG. 1, sensor 10 is configured to generate a sensor output signal at a sensor output (and here two sensor output signals at outputs OUTA 12c, OUTB 12d) coupled to a pull up voltage VPU through a pull up resistor RPU (and here two pull up resistors 14a, 14b) includes a digital output control feedback loop. The sensor 10 includes one or more sensing elements 20 to generate a sensing element output signal indicative of a sensed parameter associated with a target 18. A processor 40 is responsive to the sensing element output signal and generates a processor output signal indicative of the sensed parameter. A digital output controller 54 is responsive to the processor output signal and to a digital feedback signal 52 and is configured to generate a controller output signal. The controller output signal is coupled to an analog output driver (and here two independent output drivers 44a, 44b) that is configured to generate the sensor output signal(s) at desired levels, such as a at first predetermined level or a second predetermined level. A feedback circuit 50 is coupled between the sensor output 12c, 12d and the digital output controller 54 and generates the digital feedback signal in response to the sensor output signal.

With this arrangement, a sensor 10 is provided with a digital output control feedback loop that dynamically compensates for a load that can include a wide range of pull up voltages VPU and pull up resistances RPU. The sensor 10 measures the pull up voltage VPU and computes the pull up resistance RPU and dynamically compensates for (i.e., dynamically adapts to) their user selectable levels in order to achieve desired sensor output signal levels, which output signal levels can include a plurality of levels or ranges of levels to communicate desired information. Because the digital output control feedback loop compensates for the pull up voltage and pull up resistance levels, diagnostics performed on the sensor output can accurately determine if an output fault has occurred. Customizable output signal slew rate and shaping can be implemented with the digital output control feedback loop.

Sensor 10 and target 18 may take various forms. As non-limiting examples, sensor 10 can be a magnetic field sensor, in which case the sensing element(s) 20 include on or more magnetic field sensing elements. Magnetic field sensors can sense a magnetic field strength in order to detect proximity of the target 18, speed of motion of target, direction of motion of the target, angular position of the target relative to the sensor, and/or a current level through a conductor target, as examples. Magnetic field sensor applications include, but are not limited to, a magnetic switch that senses the proximity of a ferromagnetic object, a rotation detector (or movement detector) that senses passing features of a target, an angle sensor that senses an angle of a direction of a magnetic field, a current sensor that senses a magnetic field generated by a current carried by a conductor, and a linear magnetic field sensor that senses a magnetic field density of a magnetic field. Sensor 10 could also be an optical sensor or a pressure sensor as other non-limiting examples. In general, sensor 10 can be any sensor that generates one or more output signals at one or more respective open drain (or open collector) outputs, which outputs are configured to be pulled up to a pull up voltage through a pull up resistance.

Depending on the sensor type and parameter to be sensed by the sensing elements 20, the target 18 can take various forms. For example, in the case of a magnetic field sensor 10 with magnetic field sensing elements 20, the target 18 can be a ring magnet with detectable magnetic domains or a ferromagnetic target with features (e.g., gear teeth) that pass the sensor as the target rotates, in which case the magnetic field sensor can be used with a so-called back-bias magnet.

Sensor 10 can have a first terminal 12a coupled to a power supply denoted as VCC and a second terminal 12b coupled to a fixed reference voltage, for example, a ground voltage, denoted as GND. A third terminal 12c (and here also a fourth terminal 12d) of the sensor 10 permits communication of a sensor output signal(s) to circuits and systems external to the sensor. As will be appreciated, while the example sensor 10 includes two output terminals 12c, 12d to communicate respective output signals, in general, sensor 10 can have one or more output terminals.

Figure 1A:
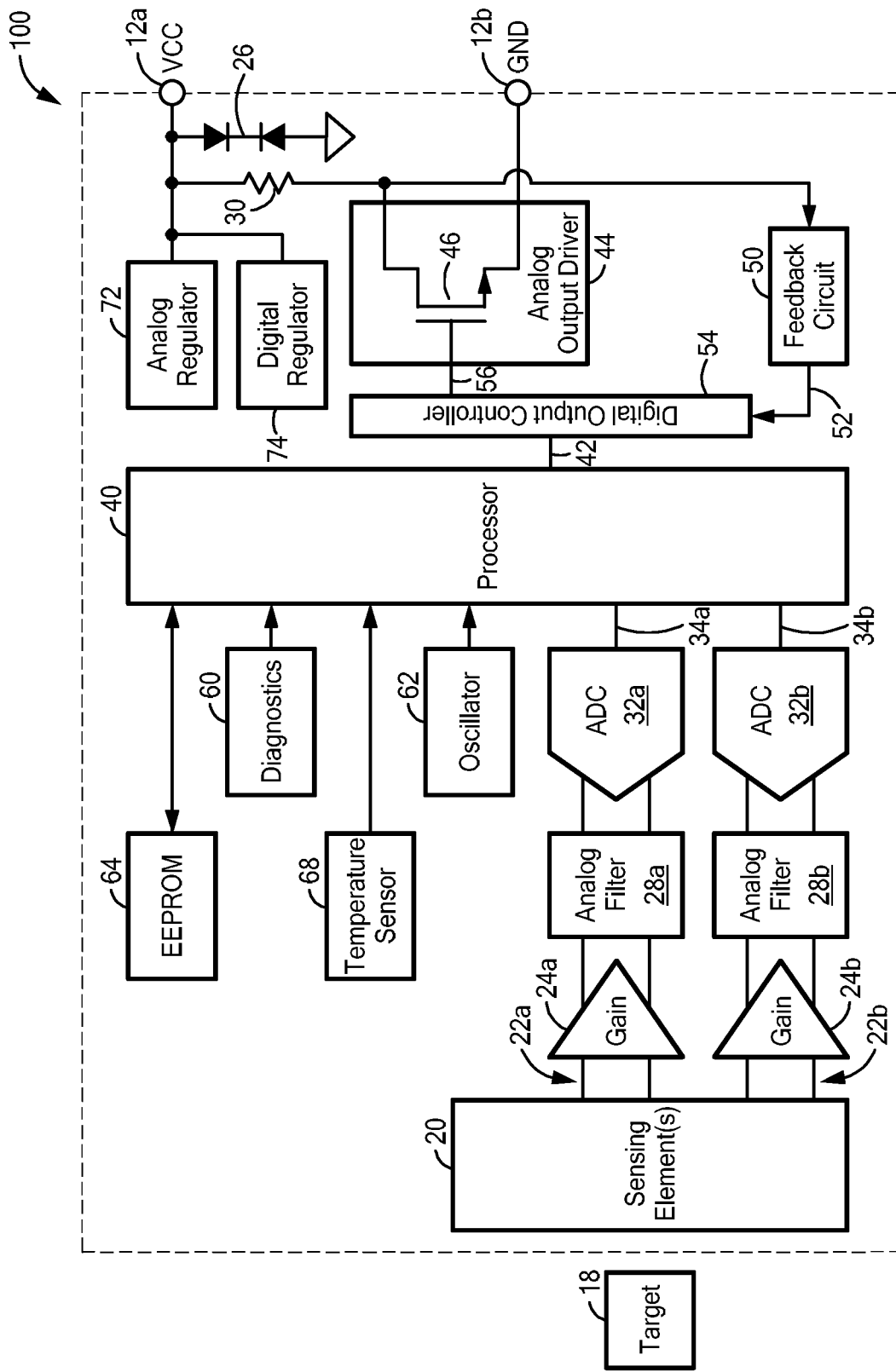
FIG. 1A is a block diagram showing an example two terminal configuration for a sensor according to the disclosure.

The sensor output signals can be provided in the form of a voltage signal in a so-called three (or here four) wire, or three terminal configuration (FIG. 1) or a current signal in a so-called two wire, or two terminal configuration (FIG. 1A).

Each sensor output 12c, 12d is coupled to an external pull up voltage VPU and pull up resistor RPU 14a, 14b, respectively as shown. Pull up voltage VPU is referenced to the same reference potential (GND) as the sensor 10. External capacitors 16a, 16b can be coupled to the sensor outputs 12c, 12d, respectively, in order to filter noise.

Such external components (i.e., pull up voltage VPU, pull up resistors 14a, 14b, and capacitors 16a, 16b) can be user selectable and, advantageously, the digital output control feedback loop permits a user to select from a relatively wide range of pull up voltages VPU and pull up resistances RPU. In general, the maximum pull up voltage VPU can be as large as the rating of the sensor output permits and the minimum pull up voltage VPU for a given pull up resistance RPU can be the minimum voltage necessary to permit the analog driver to be shut off in order to accommodate the output signal to be at the pull up voltage level. The minimum pull up resistance for a given pull up voltage VPU is dictated by the maximum current that the sensor output can sink and the maximum pull up resistance for a given pull up voltage VPU is dictated by the smallest level of current than can be pulled through the output driver.

It will be appreciated that the supply voltage level VCC and the pull up voltage level VPU may or may not be the same, depending on the application and system requirements. It will also be appreciated that while outputs 12c, 12d are illustrated to be coupled to the same pull up voltage VPU and the same pull up resistance RPU, such is not a requirement. In some applications, a user can couple different sensor outputs to different pull up voltages and resistances.

In some applications, the pull up voltage VPU can be selected from preset levels. For example, the pull up voltage VPU can be 5.0 volts or 12.0 volts nominally. In the example embodiment in which the pull up voltage VPU can be 5.0 volts or 12.0 volts nominally, the resistance pull up resistors 14a, 14b can be 1 Kohm or 3 Kohms and the capacitance of capacitors 16a, 16b can be on the order of 2.2 nF. In an embodiment, a nominal pull up voltage 5.0 volts supports an output signal having first and second predetermined levels of 1.0 volt and 4.0 volts and a nominal pull up voltage of 12.0 volts supports an output signal having first and second predetermined levels of 2.4 volts and 9.6 volts. In other embodiments, the pull up voltage VPU can be user programmable, for example within a specified range of voltages, and also the desired predetermined output signal levels can be user programmable.

According to the disclosure, the sensor 10 detects and/or computes the pull up voltage VPU and the resistance of pull up resistors 14a, 14b and uses these values to control generation of the output sensor output signals with desired levels accordingly. More particularly, the digital output control feedback loop including feedback circuit 50 and digital output controller 54 function to generate and maintain the sensor output signals with the desired signal levels.

The sensor output signals can have various signal levels depending on the sensor type, sensed parameter, and application requirements. Example sensor output signal levels are shown and explained in connection with FIGS. 3 and 3A. Suffice it to say here that, in general, the sensor output signals are at (at least) a first predetermined level or a second predetermined level. It will be appreciated that in some embodiments, the first predetermined level and the second predetermined level between which the output signals switch are logic signal levels (i.e., a logic high level and a logic low level as may represent the output signals of the sensing elements 20 being above or below a threshold in the case of a magnetic field switch or latch or in the case of gear tooth sensor as examples). In other embodiments in which the sensor output signals are analog, time-varying signals, the first and second predetermined levels may be a subset of any number of signal levels that the analog signal can assume (e.g., in applications in which the sensor is a linear device providing a sensor output signal as a sinusoidal signal having a magnitude indicative of a magnetic field strength).

Sensor 10 can be provided in the form of an integrated circuit (IC), with terminals 12a-12d provided by pins or leads of the IC. The pull up voltage VPU, pull up resistors 14a, 14b, and capacitors 16a, 16b are external to the IC, as shown.

Example sensor 10 is a magnetic field sensor capable of detecting speed and direction of a rotating target 18. To this end, sensing elements 20 can include one or more magnetic field sensing elements, such as Hall effect elements, magnetoresistance elements, or magnetotransistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

In an example, sensing elements 20 include three magnetic field sensing elements, with pairs of such elements coupled to generate first and second differential voltage signals 22a, 22b, as shown. First differential signal 22a can be coupled to a first amplifier 24a and second differential signal 22b can be coupled to a second amplifier 24b. Amplified signals generated by amplifiers 24a, 24b can be coupled to respective filters 28a, 28b to remove undesirable spectral components and the signals thus filtered can be converted into digital signals 34a, 34b by respective analog-to-digital converters (ADCs). Elements 24a, 28a, 32a can form a so-called first processing channel and elements 24b, 28b, 32b can form a so-called second processing channel, sometimes arbitrarily referred to as "right" and "left" channels.

Digital channel signals 34a, 34b are coupled to processor 40. Processor 40 is also responsive to other information, such as diagnostic information from diagnostic circuitry 60 and temperature information from temperature sensor 68. Processor 40 generates a processor output signal indicative of the sensed parameter and other information for communication. In the example sensor 10, processor 40 generates signals 42a, 42b, each associated with a respective channel and indicative of passing features of a gear target 18 for example. To this end, processor 40 compares signal levels 34a, 34b to one or more thresholds in order to generate processor output signals 42a, 42b having logic high and logic low values, in order to thereby cause respective sensor output signals to be at the first predetermined level or the second predetermined level, respectively.

Because the channel signals 34a, 34b are generated by different pairs of magnetic field sensing elements 20 having different spacing relative to the target 18, it will be appreciated that the signals 34a, 34b have edges that differ in time (which is equivalent to phase for a particular signal frequency, i.e., particular rotation speed). Movement speed of the target 18 can be detected in accordance with the frequency of either of the channel signals 34a, 34b. In this way, channel signals 34a, 34b can be considered to contain redundant target speed information. It should be appreciated that a direction of rotation of the target 18 may be determined from a relative phase or relative time difference (e.g., lag or lead) of a particular edge transition in the signal 34a compared with a particular corresponding edge transition in the signal 34b. Therefore, a relative lag or a lead of edges of the signals 34a, 34b can be used to identify a direction of rotation of the target 18.

The sensor output signals can be digital signals indicative of the channel signals 34a, 34b and thus, can have edges indicative of the passing features of the target 18 and an external controller (e.g., an engine control unit in an automotive application) can process the output signals in order to thereby determine target rotation speed and/or direction. The sensor 10 can also include programmable output signal protocol options including providing the sensor output signals in the form of independent channel signals on respective outputs, an XOR speed signal (generated from a logical exclusive-OR operation on the channel signals), and/or a direction signal indicative of a direction of motion of the target (e.g., with direction encoded as pulse width).

Diagnostic circuitry 60 can include various circuitry for monitoring and detecting faults, failures, or errors in the sensor 10. Examples include, but are not limited to signal level variations between channel signal 34a, 34b being greater than a predetermined amount, overcurrent conditions, regulated voltages being above or below specified ranges, etc.

Figure 3:
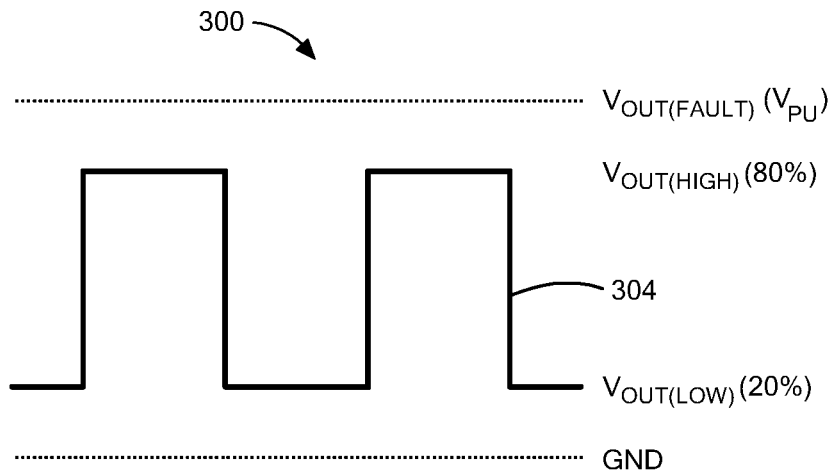
FIG. 3 is a graphical diagram showing an example output signal of the sensor of FIGS. 1 and 2.
Figure 3A:
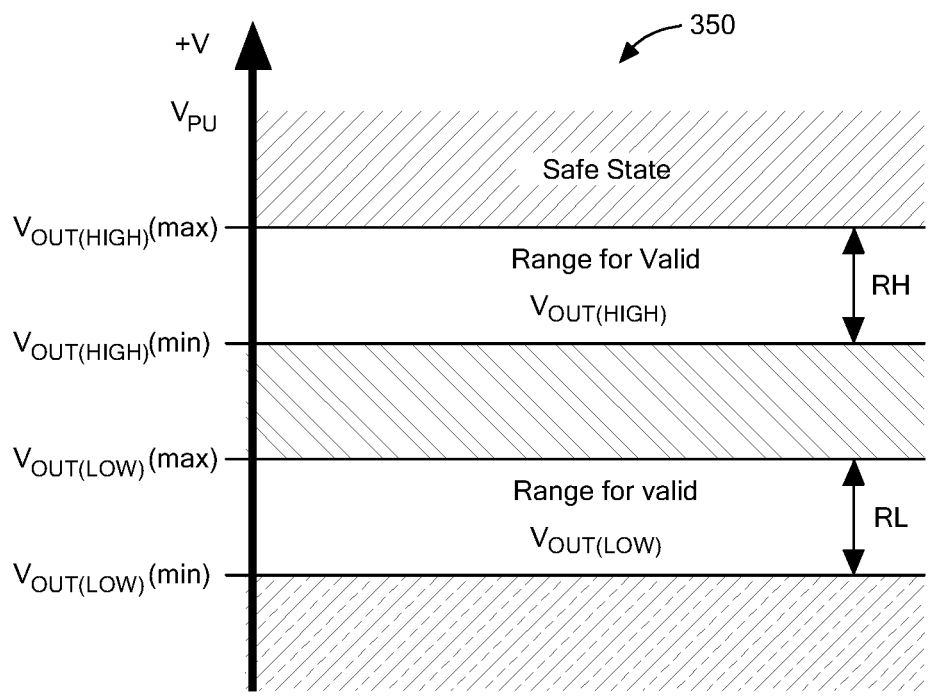
FIG. 3A is a graphical diagram showing example output signal ranges for the sensor of FIGS. 1 and 2.

As shown in the example output signal levels of FIGS. 3 and 3A, faults can be communicated by forcing the sensor output signals to a different level than is used to communicate normal operation information. For example, in the case where the output signal toggles between first and second predetermined levels in normal operation, detection of a fault can result in the output signal being forced to a third level (or to toggle between third and fourth levels). Some sensors define normal operation output signal levels to be different than a supply voltage level or ground in order to permit a fault to be communicated by driving the output to the supply voltage level or ground. One such sensor is described in a U.S. Patent Publication No. US-2020-0025837-A1, entitled "Ratiometric Sensor Output Topology And Methods" which application is assigned to the Assignee of the subject application and which is hereby incorporated by reference in its entirety.

Processor output signals 42a, 42b are coupled to digital output controller 54. Digital output controller 54 is additionally responsive to a digital feedback signal 52 and is configured to generate a controller output signal (and here two such signals 56a, 56b) for coupling to respective analog output drivers 44a, 44b, as shown.

Each of the analog output drivers 44a, 44b responds to the respective controller output signal 56a, 56b in order to generate a sensor output signal at a respective output 12b, 12c. Analog output drivers 44a, 44b will be described further in connection with FIG. 2. Suffice it to say here that each driver 44a, 44b has an open drain configuration including a controllable current sink 46a, 46b having at least a control terminal and a terminal at which the respective sensor output signal is provided, as shown. In operation, the current sink 46a, 46b draws current from the respective output so as to effectively pull the output voltage to the desired level. As noted above, feedback circuit 50 is coupled to sensor outputs 12b, 12c and generates the digital feedback signal 52 for use by the digital output controller 54 in order to generate and maintain the sensor output signals at the desired levels.

Additional elements of sensor 10 include an analog regulator 72 to generate a regulated voltage to power analog portions of the sensor and a digital regulator 74 to generate a regulated voltage to power digital portions of the sensor. An oscillator 62 can generate one or more timing, or clock signals for use by processor 40 and other circuit elements. ESD protection elements 26 can be coupled to sensor terminals 12a-12d as shown. Memory 64, such as an EEPROM, can store various sensor values including, but not limited to codes corresponding to current levels through the current sink 46a, 46b necessary to generate the sensor output signals at desired predetermined levels as will be described.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

Referring also to FIG. 1A, an alternative sensor 100 is shown in which like elements with respect to sensor 10 are labeled with like reference numbers. Sensor 100 differs from sensor 10 in that it has a two terminal output configuration in which the sensor output signal is provided in the form of a current superimposed on the sensor power terminal 12a and ground terminal 12b. Accordingly, sensor 100 contains only one analog output driver 44 that may be the same as or similar to driver 44a or 44b or FIG. 1. Processor 40 generates processor output signal 42 for coupling to digital output controller 54. Here again, digital output controller 54 is responsive to processor output signal 42 and to digital feedback signal 52 to generate a control signal 56 for coupling to the analog output driver 44. Driver 44 generates the sensor output signal on the power and ground terminals 12a, 12b by drawing current through internal resistor 30.

Figure 2:
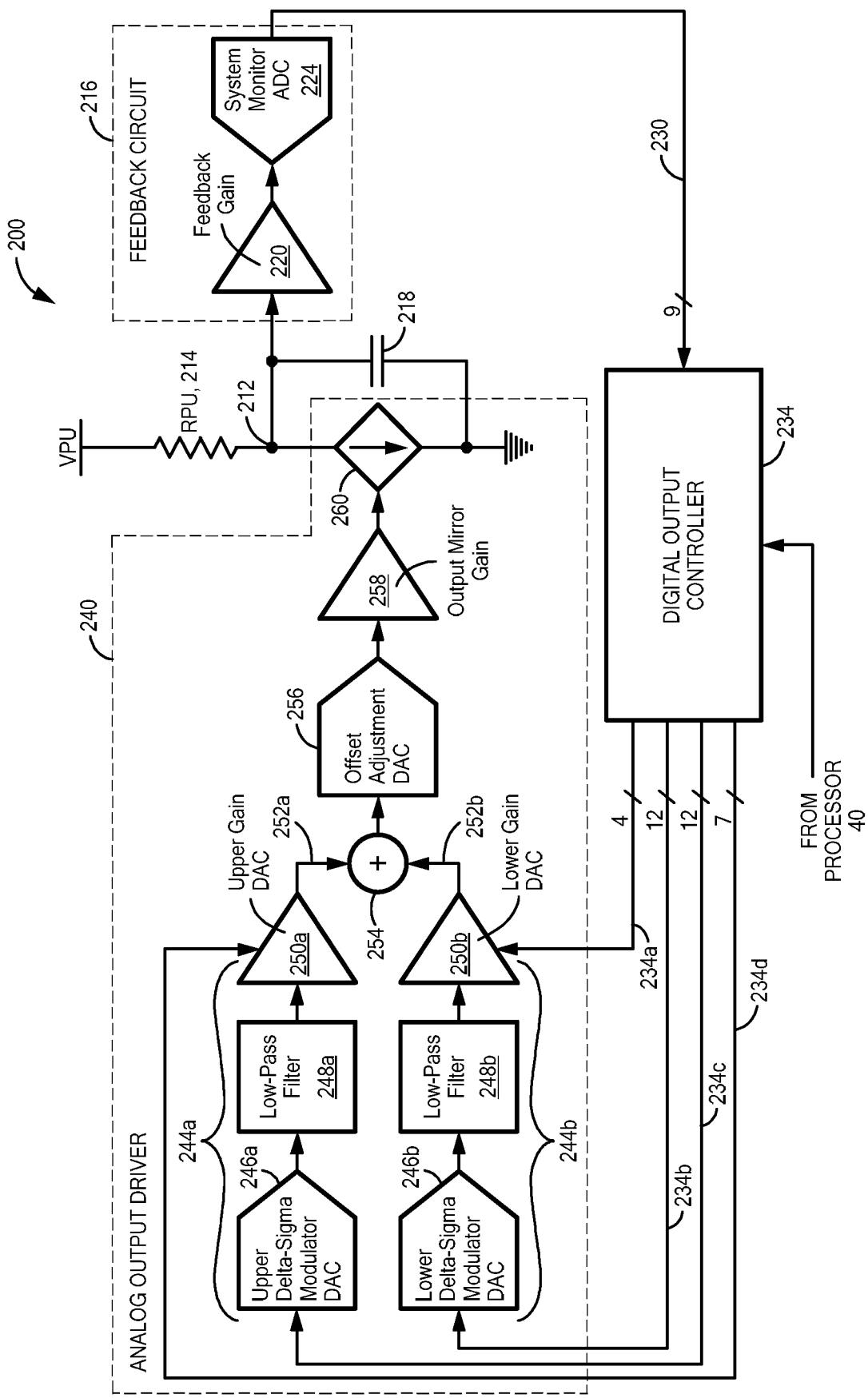
FIG. 2 is a block diagram of the sensor of FIG. 1 showing additional detail of a feedback circuit and analog output driver according to the disclosure.

Referring to FIG. 2, a more detailed block diagram of a portion 200 of sensor 10 is shown. In particular, elements of the feedback circuit 216 and the analog output driver 240 are shown. Feedback circuit 216 can be the same as or similar to feedback circuit 50 of FIG. 1 and analog output driver 240 can be the same as or similar to analog output driver 44a or 44b of FIG. 1. It will be appreciated that while only a single analog output driver 240 providing a respective sensor output 212 is shown and described in connection with FIG. 2 for simplicity, an identical or similar driver and output can be provided for one or more additional sensor outputs.

Feedback circuit 216 is coupled between the sensor output 212 (that may be the same as or similar to sensor output 12c or 12d in FIG. 1) and the digital output controller 234 (that may be the same as or similar to digital output controller 54 of FIG. 1). The feedback circuit 216 is configured to generate the digital feedback signal 230 in response to the sensor output signal.

More particularly, feedback circuit 216 includes a feedback gain element 220 having an input coupled to the sensor output 212 and an output coupled to a system monitor ADC 224. The feedback gain element 220 may take the form of an amplifier and apply a gain to the sensor output signal. For example, gain element 220 can reduce the amplitude of the sensor output signal to a level suitable for processing by the sensor 10. The gain-adjusted signal generated by element 220 is converted into a digital signal by system monitor ADC 224, as may take the form of a nine bit ADC in some embodiments. Thus, digital feedback signal 230 is indicative of a level of the sensor output signal.

The digital feedback signal 230 is coupled to digital output controller 234 that processes the feedback signal to determine adjustments to be made by the analog output driver in order to achieve the desired sensor output signal levels. A process implemented by the digital output control feedback loop, including feedback circuit 216 and digital output controller 234, is described in connection with the flow diagram of FIG. 4. Suffice it to say here that the digital output control feedback loop is configured to detect the level of the pull up voltage VPU, compute the resistance of the pull up resistor RPU, and use this information to determine an appropriate level of current through the controllable current sink (e.g., current sink 44a of FIG. 1) in order to achieve the desired sensor output signal levels.

The digital output controller 234 is further responsive to one or more processor output signals (e.g., signals 42a, 42b of FIG. 1). Outputs 234a-234d of the digital output controller 234 are coupled to elements of the analog output driver 240 as will be described.

Analog output driver 240 includes a first circuit path 244a, a second circuit path 244b, and a summation element 254. First circuit path 244a functions to establish a reference current level necessary to generate a sensor output voltage at the first predetermined level (e.g., a low sensor output signal requiring a high current sink level by the driver) and second circuit path 244b functions to establish a reference current level necessary to generate a sensor output voltage at the second predetermined level (e.g., a high sensor output signal requiring a low current sink level by the driver).

First circuit path 244a can include a first digital-to-analog converter (DAC) 246a, a first low pass filter 248a coupled to an output of the first DAC, and a first gain adjustment DAC 250a coupled to an output of the first low pass filter and configured to generate an upper analog adjustment signal 252a. Second circuit path 244b can include a second DAC 246b, a second low pass filter 248b coupled to an output of the second DAC, and a second gain adjustment DAC 250b coupled to an output of the second low pass filter and configured to generate a lower analog adjustment signal 252b. In an embodiment, DACs 246a, 246b can be twelve bit delta-sigma modulator DACs and thus, can receive twelve bit control signals 234b, 234d from digital output controller 234. Filters 248a, 248b can remove undesirable high frequency components and gain adjustment DACs 250a, 250b increases the signal magnitude.

Summation element 254 is coupled to receive and sum the upper analog adjustment signal 252a and the lower analog adjustment signal 252b, as shown. The output of the summation element 254 is indicative of a current level to sink that is sufficient to achieve the desired output signal levels. The number of bits (i.e., resolution) of the upper and lower gain DACs 250a, 250b can vary to suit a particular application and output signal requirements. In an embodiment, upper gain DAC 250a is a four bit DAC and lower gain DAC 250b is a twelve bit DAC.

Analog output driver 240 may further include an offset adjustment DAC 256 coupled to receive the output of the summation element 254 and a current mirror 258. Offset adjustment DAC 256 can function as an adjustable voltage source to reduce or eliminate offset associated with current mirror 258.

Current mirror 258 generates a control signal for applying to the controllable current sink 260 based on the summed reference currents 252a, 252b. Various schemes are possible for implementing the controllable current sink 260. In some embodiments, the controllable current sink 260 represents an output path of the current mirror. In other embodiments, the controllable current sink 260 can include a FET having a plurality of independently controllable stages in order to permit different, respective output signal levels to be generated by switching in and out elements, thereby controlling the amount of current through the sensor output.

With the described output configuration, a plurality of output signal levels and ranges of levels can be established.

Furthermore, because the output signal levels are tightly controlled, an external controller can measure the sensor output signal level and accurately detect faults of the sensor output itself by determining of the measured output signal level is within expected limits. Stated differently, because the digital output feedback loop dynamically compensates for the pull up voltage and pull up resistance, when the sensor output signal is detected to be out of range, it can be readily determined that the failure is in the sensor output itself (e.g., rather than the pull up voltage or pull up resistance being out of an expected range).

As noted above, the digital output control feedback loop, including feedback circuit 216 and digital output controller 234, can be advantageous for use with various desired sensor output signal levels. Examples of such signal levels are shown in FIGS. 3 and 3A. It will be appreciated however, that other sensor output signal levels can be implemented and dynamically controlled by the described digital feedback loop. In general, the output signal levels can range from the pull up voltage VPU to ground (or more particularly, to a minimum level necessary to cause a level of current to be pulled through the output in order to bring the output signal to the desired low level).

FIG. 3 shows an example "ratiometric" sensor output signal 304 in which detection of a fault can be communicated by pulling the output to the level of the pull up voltage VPU or to ground. In order to accommodate this arrangement of conveying a failure state by outputting the pull up voltage (VPU) or ground (GND), the sensor output signal levels during "normal" operation (i.e., when there is no detected failure) are at a level other than VPU or ground. In the example of FIG. 3, graph 300 illustrates that during normal operation, the output switches between $V_{OUT(HIGH)}$ (X % of the supply voltage, such as nominally 80%) and $V_{OUT(LOW)}$ (Y % of the pull up voltage VPU, such as nominally 20%). It will be appreciated that normal operation sensor output signal levels are possible that are not a percentage of the pull up voltage or supply voltage. This arrangement allows for VPU or ground to be used to communicate faults detected by internal diagnostics 60 and for open wire or short circuits faults to be communicated.

FIG. 3A illustrates ranges of voltage levels 350 that can be used to communicate desired levels of the sensor output voltage. For example, a first predetermined output level can be indicated when the sensor output signal is within a range labeled RL and a second predetermined output level can be indicated when the sensor output signal is in a range labeled RH. In embodiments implementing a ratiometric output, a valid high output signal $V_{OUT(HIGH)}$ thus can be expressed as a range, for example 70-90%, of the pull up voltage VPU and a valid low output signal $V_{OUT(LOW)}$ can be expressed as a range, for example 10-30% of the pull up voltage VPU.

Any output signal that does not fall within the valid high range RH or the valid low range RL can be considered to indicate a fault. For example, a sensor output signal that is above 90% of VPU can indicate a fault. Similarly, a sensor output signal falling between 30%-70% of VPU can indicate a fault and a sensor output signal below 10% of VPU can indicate a fault. Thus, it is possible to convey a fault by outputting any voltage that does not fall within one of the ranges for a valid high or low level output signal. In some embodiments, a specific fault can be indicated by driving the output to either VPU or GND, such as an open circuit or short circuit.

It should be apparent that the ranges of 10-30% for the low value and 70-90% for the high value are only example numbers, and any value could be used having any range, so long as the ranges are not overlapping in order to thereby permit a high output signal level to be distinguished from a low output signal level. For example, the low value could be 15-40% and the high value could be 60-95%, so long as one range is provided for the low value and another range is provided for the high value, and they do not overlap with each other.

Figure 4:
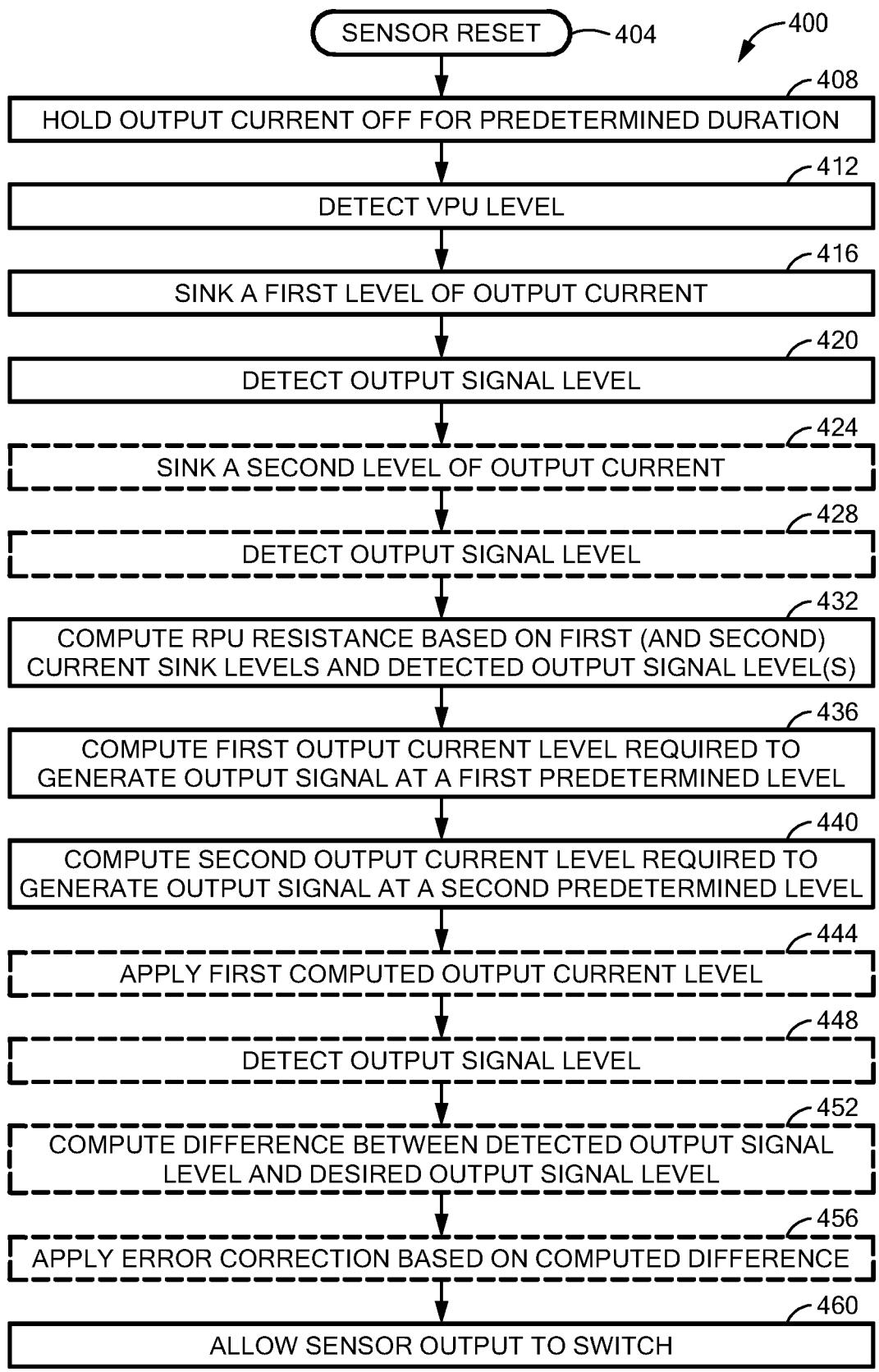
FIG. 4 is a flow diagram illustrating an example process for detecting the pull up voltage and pull up resistance to achieve desired output signal level.

Referring to FIG. 4, an example process for detecting and processing the pull up voltage VPU and pull up resistance RPU in order to achieve desired output signal levels is shown. At block 404, a sensor reset event occurs. Sensor reset events can include powering on the sensor device (i.e., at start up), coming out of a safe state (i.e., a retry), an ESD event of a predetermined magnitude or, more generally, any condition upon which the output controller 234 considers the sensor to be reset. Following the sensor reset event, in block 408, the driver controllable current sink (e.g., sink 260) are held off for a predetermined duration in order to allow the sensor output to be pulled up and settle at the pull up voltage VPU. In an example embodiment, the current sink is held off for an initialization, power on period, such as on the order of fifty microseconds after a minimum pull up voltage level is detected. At block 412, the VPU level is measured by the feedback circuit 216. For example, the system monitor ADC 224 can compare the output signal level to a threshold. Thus, at this measurement, the digital feedback signal 230 has a level indicative of the pull up voltage level VPU and the measured pull up voltage level can be stored in EEPROM.

Thereafter at block 416, the current sink 260 is set to sink a first, relatively low current and the output signal level is detected by the feedback circuit at block 420. Thus, the detected output signal level corresponds to the signal level generated by sinking the first current through sink 260.

Optional blocks 424, 428 include setting the current sink 260 to sink a second, higher current and detecting the output signal level, respectively. In other words, blocks 424, 428 repeat blocks 416, 420, but while sinking a higher current through current sink 260.

At block 432, resistance of the pull up resistor RPU is computed by the digital output controller 234. In the case where optional blocks 424, 426 are not performed, the resistance can be computed by dividing the output signal voltage level detected at block 416 by the first current sink level applied in block 420. In the case where optional blocks 424, 426 are performed, the resistance can be computed by dividing the output signal voltage level detected at block 416 by the first current sink level applied in block 420 and dividing the output signal voltage level detected at block 428 by the second current sink level applied in block 424 in order to thereby compute two levels of resistance RPU, and then taking an average of the two resistance levels in order to determine the pull up resistance.

Use of the two operating points in this manner can result in a more accurate calculation of the pull up resistance than only a single operating point by overcoming some non-idealities such as non-linearities (e.g., in the output driver itself and other components).

At block 436, a first level of output current thorough the current sink 260 necessary in order to generate the sensor output signal at the first predetermined level is computed. This computation is based on the pull up voltage level detected at block 412, the pull up resistance level computed at block 432, and the desired first predetermined output voltage level. More particularly, the computation can be given by: Isink1=(VPU−VOUT1)/RPU where VOUT1 is the first predetermined output voltage level.

At block 440, a second level of output current thorough the current sink 260 necessary in order to generate the sensor output signal at the second predetermined level is computed. This computation is based on the pull up voltage level detected at block 412, the pull up resistance level computed at block 432, and the desired second predetermined output voltage level. More particularly, the computation can be given by: $Isink2=(VPU-VOUT2)/RPU$ where VOUT2 is the second predetermined output voltage level. The computed current levels Isink1, Isink2 can be stored in EEPROM.

Optional blocks 444, 448, 452, and 456 can be performed in order to improve the accuracy of the output signal levels. At block 444, the first computed output sink current is applied to current sink 260 and at block 448 the sensor output signal level is measured by the feedback circuit. At block 452, a difference between the measured output signal level and the desired level (i.e., the first predetermined level) is computed. This difference represents an error and can be used to adjust the output current level through the sink 260 at block 456 in order to achieve the desired output signal levels.

At block 460, the dynamic output calibration is completed, and the sensor outputs are permitted to switch according to the operation of the sensor. It will be appreciated that while the process 400 describes generating first and second predetermined levels of an output signal for a single output, the process can be repeated for additional sensor outputs.

During normal operation (after block 460, when the output is permitted to switch), the output signal level is monitored periodically by the digital output control feedback loop in order to determine if it is at the desired, predetermined level and, if there is a variation (or a variation of a predetermined amount), then the current through the output driver is adjusted (i.e., a correction factor is applied) in order to bring the output signal to the desired, predetermined level. In this way, the digital output control feedback loop operates to dynamically calibrate the output signal in order to compensate for variations as may occur for various reasons such as fluctuations in the pull up voltage VPU, temperature variations, and/or aging to name a few. In other words, blocks that are similar to or the same as blocks 448-456 can be repeated periodically during normal operation after the sensor output is allowed to switch, albeit generally at a slower rate that would occur during the initialization process 400.

Figure 5:
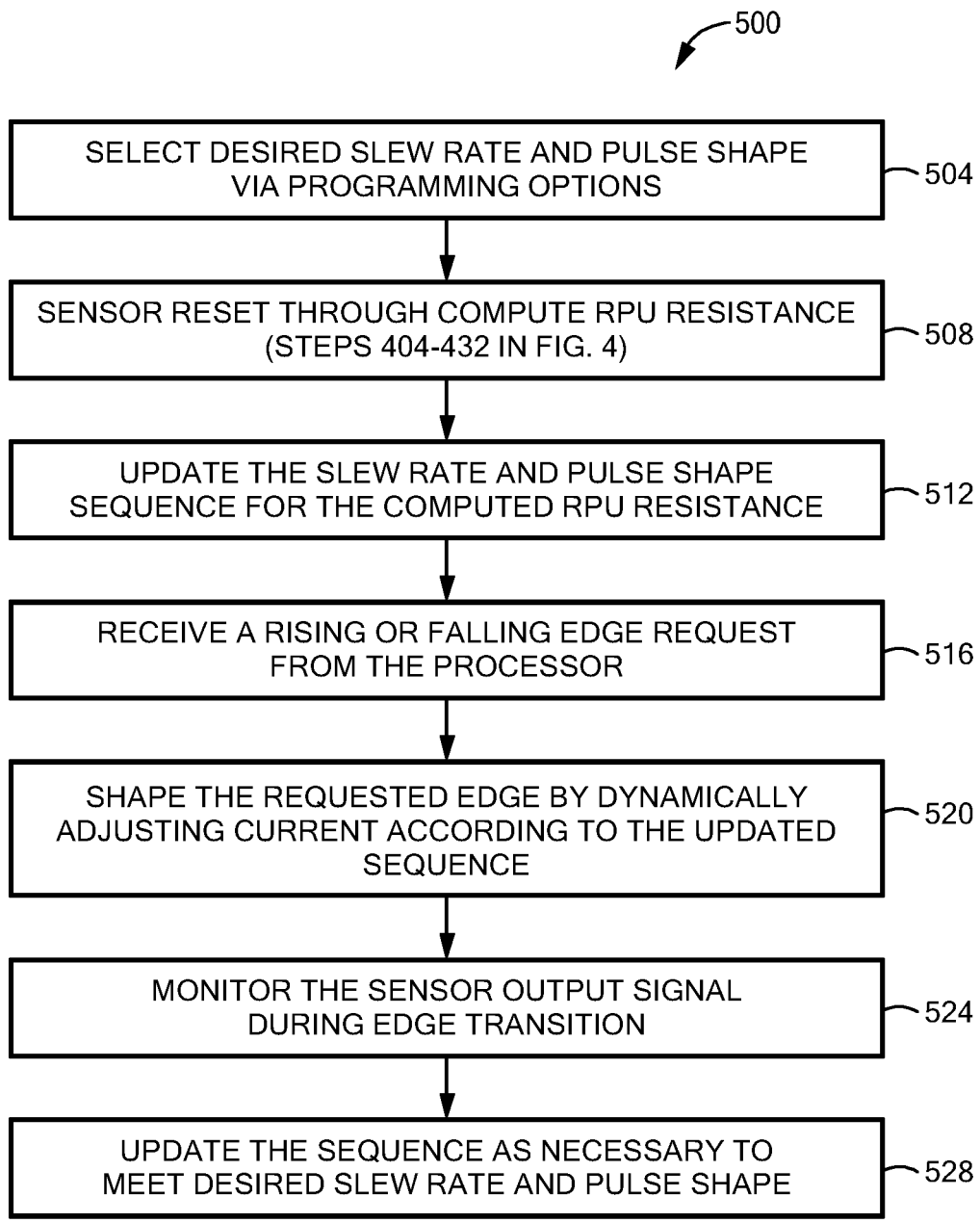
FIG. 5 is a flow diagram illustrating an example process for dynamic slew rate compensation and output signal shaping.

According to an aspect of the disclosure, the digital output control feedback loop, including feedback circuit 216 and digital output controller 234, can implement dynamic, customized slew rate compensation and output signal shaping according to a process 500 illustrated in FIG. 5. It will be appreciated that adjusting output signal slew rate and/or pulse shape can improve radiated emissions.

At block 504, a desired slew rate and pulse shape can be selected according to sensor programming options. As examples, programming options can allow a user to select a desired slew rate and signal shape for one or both of the falling and rising edges of the sensor output signals. Options can be preset and selectable or more customizable. By way of a simple example, a user can select from between a nominal step size and a fast step size and can further select from between a nominal step frequency and a fast step frequency. And as a further example, a user can define elaborate transition shapes and timing to achieve a desired result.

It will be appreciated that the complexity of the slew rate adjustment and pulse shaping that can be achieved is a function of, and thus can be limited by, the size of memory 64, the speed of the system clock, and the number of DAC code bits the DACs 250a, 250b can resolve. It will also be appreciated that, with the described analog output driver configuration, the falling edge of sensor output signals can be more readily customized due to the current sink open drain output configuration.

The slew rate and pulse shape options thus selected are implemented upon the next sensor reset event. Thus, at block 508, several bocks from the dynamic output calibration process of FIG. 4 are performed. Specifically, block 508 can included blocks 404 through 432 in FIG. 4. Thus, in block 508, the VPU voltage level has been measured and the pull up resistance RPU has been computed.

At block 512, a stored slew rate and pulse shape sequence for the sensor output signal is updated according to the programmed code, or sequence. More particularly, EEPROM 64 can contain stored values indicative of nominal current sink levels for sink 260 necessary in order to generate a desired slew rate and pulse shape given the computed pull up resistance (as such values may have been computed at blocks 436 and 440 in FIG. 4). Such stored sequence can be as simple or complex as the design of the current sink 260 and memory capacity permit and values of the sequence can represent different output current levels in order to achieve the desired output signal characteristics. For example, a sequence can correspond to jumping a predetermined number of DAC codes at a time and at a predetermined clock rate in order to achieve a simple linear slope output signal transition at a particular slew rate.

At block 516, the digital output controller 234 receives a rising or falling edge request from the processor 40. At block 520, the desired sensor output signal shape is provided by dynamically adjusting current through sink 260 in a predefined sequence, according to the sequence updated at block 512.

The sensor output signal is monitored during output signal transitions at block 524 and, at block 528, the stored sequence is updated as necessary in order to meet the desired slew rate and pulse shape. Monitoring the sensor output can involved comparing the output signal level to a threshold at commencement of a switch event and counting to see how long it takes for the output signal to reach a second threshold. A determination can then be made as to whether a desired slew rate and pulse shape have been achieved and, if necessary, the stored sequence can be updated to adjust the current sink 260 upon the next like transition (e.g., on the next high to low output signal transition) to achieve the desired slew rate and pulse shape.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A sensor configured to generate a sensor output signal at a sensor output coupled to a pull up voltage through a pull up resistor, the sensor comprising:
   a sensing element configured to generate a sensing element output signal indicative of a sensed parameter;
   a processor responsive to the sensing element output signal and configured to generate a processor output signal indicative of the sensed parameter;
   a digital output controller responsive to the processor output signal and to a digital feedback signal, wherein the digital output controller is configured to generate a controller output signal;
   an analog output driver responsive to the controller output signal and configured to generate the sensor output signal at a first predetermined level or at a second predetermined level; and
   a feedback circuit coupled between the sensor output and the digital output controller and configured to generate the digital feedback signal in response to the sensor output signal.

2. The sensor of claim 1, wherein the analog output driver comprises a controllable current sink having a having a first terminal at which the sensor output signal is provided, a second terminal, and a third, control terminal responsive to a control signal.

3. The sensor of claim 2, wherein the analog output driver further comprises:
   a first circuit path comprising a first DAC, a first low pass filter coupled to an output of the first DAC, and a first gain adjustment DAC coupled to an output of the first low pass filter and configured to generate an upper analog adjustment signal;
   a second circuit path comprising a second DAC, a second low pass filter coupled to an output of the second DAC, and a second gain adjustment DAC coupled to an output of the second low pass filter and configured to generate a lower analog adjustment signal; and
   a summation element coupled to the first gain adjustment DAC and the second gain adjustment DAC and configured to generate a summation signal indicative of a summation of the upper analog adjustment signal and the lower analog adjustment signal.

4. The sensor of claim 3, wherein the analog output driver further comprises:
   an offset adjustment DAC responsive to the summation signal and configured to generate an analog version of the summation signal; and
   a current mirror responsive to the analog version of the summation signal and configured to generate the control signal for coupling to the control terminal of the controllable current sink.

5. The sensor of claim 1, wherein the feedback circuit comprises a feedback gain element configured to adjust the sensor output signal and a system monitor ADC configured to convert the gain-adjusted sensor output signal into the digital feedback signal.

6. The sensor of claim 1, wherein the analog output driver is further configured to generate the sensor output signal at a third level that is different than the first level and the second level when a fault is detected.

7. The sensor of claim 6, wherein the third level of the sensor output signal corresponds to a supply voltage or ground.

8. The sensor of claim 1, wherein the first predetermined level of the sensor output signal is a first percentage of the pull up voltage and the second predetermined level of the sensor output signal is a second percentage of the pull up voltage that is different than the first percentage.

9. The sensor of claim 8, wherein the first predetermined level of the sensor output signal is within a first range of percentages of the pull up voltage and the second predetermined level of the sensor output signal is within a second range of percentages of the pull up voltage that is different than the first range of percentages.

10. The sensor of claim 2, wherein the controllable current sink comprises a field effect transistor.

11. The sensor of claim 1, wherein the sensing element comprises one or more magnetic field sensing elements.

12. The sensor of claim 1, wherein the sensed parameter comprises one or more of a magnetic field strength, a proximity of a target, a speed of motion of the target, a direction of motion of the target, an angular position of the target, a current level, a light level, or a pressure level.

13. The sensor of claim 1, wherein the processor output signal is a logic signal having a logic high level or a logic low level and wherein the sensor output signal is at the first predetermined level when the processor output signal is at the logic high level and at the second predetermined level when the processor output signal is at the logic low level.

14. The sensor of claim 1, wherein the sensor comprises an integrated circuit and wherein the sensor output signal is provided at an output terminal of the integrated circuit, wherein the pull up resistor and the pull up voltage are external to the integrated circuit.

15. The sensor of claim 1, wherein the digital output controller is configured to adjust a slew rate of the sensor output signal.

16. The sensor of claim 1, wherein the digital output controller is configured to compute a resistance of the pull up resistor.

17. A method of generating an output signal at an output of a sensor that is coupled to a pull up voltage through a pull up resistor, the sensor output signal at a first predetermined level or a second predetermined level, the method comprising:
   detecting the pull up voltage;
   sinking a first current level with a current sink coupled to the sensor output;
   detecting a first voltage level of the sensor output signal;
   computing the resistance of the pull up resistor based on the first current level and the first voltage level;
   computing a first level of current through the current sink that corresponds to generating the sensor output signal at the first predetermined level;
   computing a second level of current through the current sink that corresponds to generating the sensor output signal at the second predetermined level
   sinking the first computed current level with the current sink; and
   allowing the sensor output to switch between the first predetermined output signal level and the second predetermined output signal level.

18. The method of claim 17, further comprising:
   sinking a second current level with a current sink coupled to the sensor output; and
   detecting a second voltage level of the sensor output signal, wherein computing the resistance of the pull up resistor is based on the first current level, the first voltage level, the second current level and the second voltage level.

19. The method of claim 17, further comprising:
   determining an error correction based on a difference between the sensor output signal level when the current sink sinks the first computed current level and the first predetermined sensor output signal level; and applying the error correction to first computed level of current and to the second computed level of current.

20. The method of claim 17, wherein detecting the pull up voltage comprises turning off the current sink for a predetermined duration after a sensor reset event occurs.

21. The method of claim 17, further comprising detecting a fault, wherein allowing the sensor output to switch comprises allowing the sensor output to switch to a third level different than the high output level or the low output level when the fault is detected.

* * * * *

UNITED STATES PATENT AND TRADEMARK OFFICE
CERTIFICATE OF CORRECTION

PATENT NO. : 11,029,370 B1
APPLICATION NO. : 16/881238
DATED : June 8, 2021
INVENTOR(S) : Jonathan Zimmermann et al.

It is certified that error appears in the above-identified patent and that said Letters Patent is hereby corrected as shown below:

In the Specification

Column 1, Line 50 delete "of field" and replace with --of a field--.

Column 2, Line 22 delete "having a having a" and replace with --having a--.

Column 4, Line 41 delete ", such as a at" and replace with --, such as at a--.

Column 4, Line 43 delete "output" and replace with --outputs--.

Column 4, Line 65 delete "include on" and replace with --include one--.

Column 6, Line 40 delete "of gear" and replace with --of a gear--.

Column 8, Line 7 delete "signal" and replace with --signals--.

Column 8, Line 35 delete "signal" and replace with --signals--.

Column 9, Line 23 delete "or FIG. 1." and replace with --of FIG. 1.--.

Column 11, Line 4 delete "of" and replace with --if--.

Column 12, Line 17 delete "are" and replace with --is--.

Column 12, Line 59 delete "thorough" and replace with --through--.

Column 13, Line 1 delete "thorough" and replace with --through--.

Column 14, Line 14 delete "included" and replace with --include--.

Signed and Sealed this
Twenty-first Day of June, 2022

Katherine Kelly Vidal
*Director of the United States Patent and Trademark Office*

CERTIFICATE OF CORRECTION (continued)
U.S. Pat. No. 11,029,370 B1

Column 14, Line 45 delete "involved" and replace with --involve--.

In the Claims

Column 15, Line 23 Claim 2 delete "having a having a" and replace with --having a--.